United States Patent [19]
Fujita

[11] Patent Number: 5,914,623
[45] Date of Patent: Jun. 22, 1999

[54] 90°-PHASE SHIFTER

[75] Inventor: Kenji Fujita, Tokyo, Japan

[73] Assignee: NEC Corporation, Tokyo, Japan

[21] Appl. No.: 08/848,486

[22] Filed: May 8, 1997

[30] Foreign Application Priority Data

May 13, 1996 [JP] Japan .................................. 8-118077

[51] Int. Cl.⁶ .............................. H03H 11/16; H03K 3/00
[52] U.S. Cl. ......................... 327/254; 327/255; 327/258; 327/238; 327/243
[58] Field of Search .................................. 327/231, 233, 327/234, 237–239, 254–259, 243, 244, 245

[56] References Cited

U.S. PATENT DOCUMENTS

| | | | |
|---|---|---|---|
| 4,472,645 | 9/1984 | White ........................................ | 307/279 |
| 4,696,055 | 9/1987 | Marshall .................................. | 455/118 |
| 4,857,777 | 8/1989 | Altes ........................................ | 307/511 |
| 5,179,731 | 1/1993 | Trankle et al. ........................... | 455/291 |
| 5,317,276 | 5/1994 | Yamamoto ............................... | 328/155 |

FOREIGN PATENT DOCUMENTS 3-159305  7/1991  Japan .

*Primary Examiner*—Timothy P. Callahan
*Assistant Examiner*—An T. Luu
*Attorney, Agent, or Firm*—Whitham, Curtis & Whitham

[57] ABSTRACT

A 90°-phase shifter which operates in condition both of high-speed and low dissipation power, and an output signal with precise 90°-phase difference is capable of taking off is provided. It causes input signals with complementary relation each other to input toward input terminals. A 1/2 frequency divider is composed of bi-differential transistors Tr5 to Tr12, and load resistances R1 to R4. The ½ frequency divider outputs a 90°-phase difference signal to output terminals 11 to 14 based on collector current of signal input transistors Tr1 and Tr2. The collector current corresponds to the input signal. A duty ratio monitoring load 2 converts these collector currents into voltage. A low-pass filter 3 takes off a DC component corresponding to an offset from 50%-duty ratio of an input voltage from the converted voltage. A DC component amplifier amplifies the DC component thus performing feedback to the input terminals 8 and 9. For this reason, the duty ratio of the collector current of the signal input transistors Tr1 to Tr2 comes precisely into 50%.

14 Claims, 6 Drawing Sheets

F I G. 4A
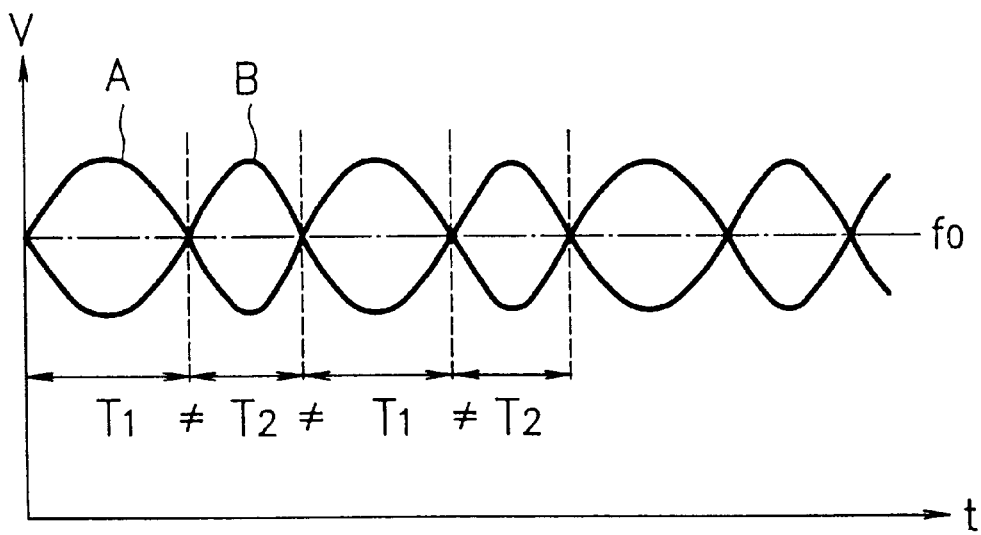
F I G. 4B
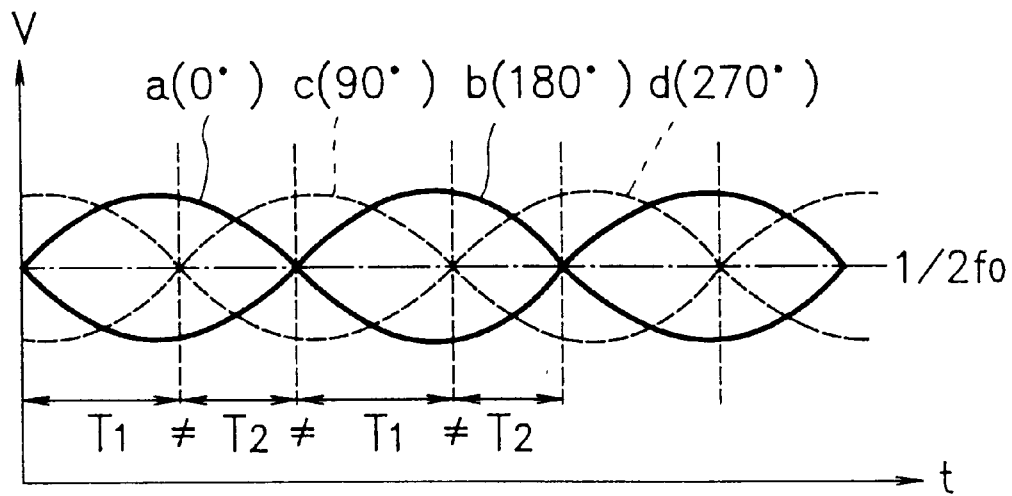

90°-PHASE SHIFTER

BACKGROUND OF THE INVENTION

The present invention relates to a 90°-phase shifter consisting of a T flip-flop, and in particular to a high-frequency 90°-phase shifter being suitable for an orthogonal modulator-demodulator in the digital communication.

Description of The Prior Art

In general, with regard to digital communication, a modulation-demodulation system such as an OPSK (orthogonal phase shift keying) system and so forth are employed for implementing thereof. In this modulation-demodulation system, an orthogonal modulator is used. Signals with 90°-phase difference from each other are employed in the orthogonal modulator. It is required that such a 90°-phase difference signal is the signal having of high precision phase difference.

As the first conventional example of a 90°-phase shifter, a 90°-phase shifter using a T flip-flop is shown in FIG. 1. The 90°-phase shifter of FIG. 1 comprises the T flip-flop consisting of signal input transistors Tr1 to Tr4 and bi-differential transistors Tr5 to Tr12. In both of input signal IN and complementary input signal (inversion signal of IN), whose each duty ratio stays of 50% are inputted toward the input terminals 21 and 22 respectively. Thereby each rotational-phase-signal of 0°, 180°, 90°, 270° is taken off as to output terminals 23, 24, 25, and 26 each of load resistances R1 to R4 corresponding to each of bi-differential transistors.

Japanese Patent Application Laid Open No. Hei 3-159305 discloses a 90°-phase shifter. This is the second conventional example thereof. In the example, phase deviation is capable of correcting. FIG. 2 is a block diagram showing the 90°-phase shifter according to Hei 2-159305. The approximate 90°-phase shifter 40 generates an output. The output is generated in such a way that it causes an input signal IN1 to implement 90° phase shifting. A synchronous detector 42 adopts an output signal V01 of adder 41 (describing later) as a reference signal. The synchronous detector 42 implements synchronous detection of the input signal IN1. A multiplier 43 multiplies the detection output by the input signal IN1. An adder 41 adds the multiplication output to the out put of the approximate 90°-phase shifter 40. An output signal Vo1 as the output of the 90°-phase shift is generated.

The 90°-phase shifter constituted as described above compares the output signal V01 with the input signal IN1. A feedback corresponding to the phase deviation from the 90° phase difference calculated by the comparison is subjected to the output signal so that the deviation of an output phase is corrected automatically. According to this method, the output signal V01 with precise 90°-phase difference is capable of being taken off.

In the 90°-phase shifter according to the first conventional example, there is a constraint that the value of duty ratio of both of the input signal IN and the complementary input signal thereof should precisely be 50%. When there is an offset of the duty ratio, the offset is outputted directly as the phase deviation from the 90°-phase.

In the 90°-phase shifter according to the second conventional example, it is difficult to operate in low dissipation current and stable operation in high-frequency, because in the above constitution, the 90°-phase shifter should employ a comparator or an operational amplifier. In general, with regard to these circuits, it is difficult to operate in low dissipation power and high-speed operation.

SUMMARY OF THE INVENTION

In view of the foregoing, it is an object of the present invention to provide a 90°-phase shifter which operates in low dissipation power and high-speed operation, and an output signal with a precise 90° phase difference is capable of being taken off stably.

According to a first aspect of the present invention, for achieving the above mentioned object, there is provided a 90°-phase shifter consisting of a ½ frequency divider employing a T flip-flop and phase shifting means for generating signal with 90°-phase difference based both on a first input signal maintained with 50%-duty ratio and a second input signal being a complementary signal of the first input signal. The 90°-phase shifter comprises calculating means for calculating DC component corresponding to an offset from 50%-duty ratio in relation to each of the first and the second input signals, and direct current feedback means performing feedback of the DC component as a bias to an input terminal end of the phase shifting means.

According to another aspect of the present invention, in the first aspect of the 90°-phase shifter wherein the calculating means comprise a first and a second transistors to which the first and the second input signals are inputted, and a first and a second loads which are connected to collectors of the first and the second transistors for taking off a DC component corresponding to an offset from the 50%-duty ratio from collector current.

According to another aspect of the present invention, in the first aspect of the 90°-phase shifter wherein the load is one of a resistance element and an inductance element.

According to another aspect of the present invention, in the first aspect of the 90°-phase shifter wherein the feedback means comprise a low-pass filter for taking off the DC component from electric potential difference between the first and the second loads, and amplifying means for amplifying the DC component before outputting it to the input terminal end of the phase shifting means.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIG. 4A is a timing chart showing operation of a 90°-phase shifter at an initial state and a waveform diagram of input terminals 8 and 9 of signal input transistors Tr1 to Tr2;

FIG. 4B is a timing chart showing operation of a 90°-phase shifter at an initial state and a waveform diagram of output terminals 11 to 14;

DETAILED DESCRIPTION OF THE PREFERRED EMBODIMENTS

A preferred embodiment of the present invention will now be described in detail referring to accompanying drawings.

[CIRCUIT CONSTITUTION]

Figure 1:
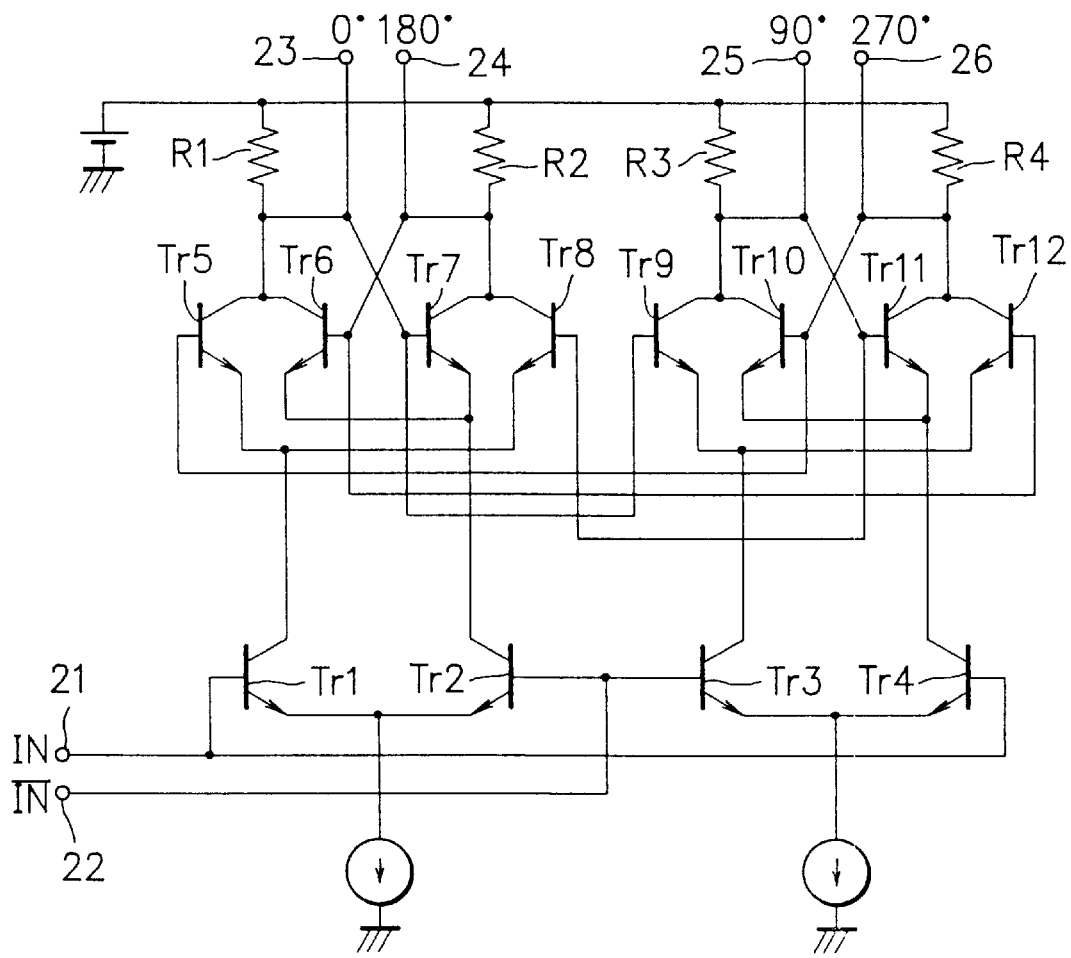
FIG. 1 is a circuit diagram of a first conventional 90°-phase shifter.
Figure 2:
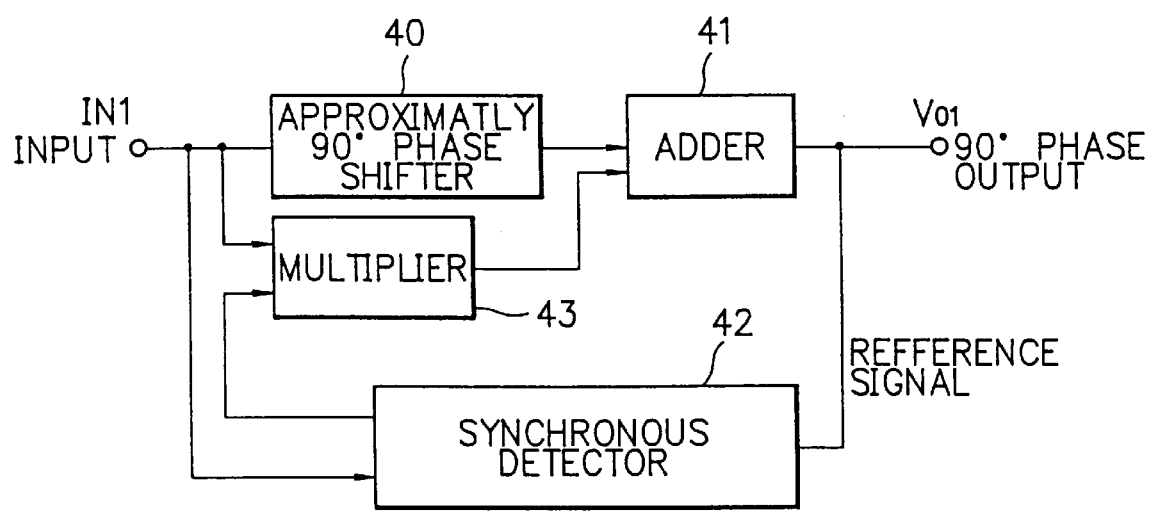
FIG. 2 is a circuit diagram of a second conventional 90°-phase shifter.

FIG. 1 is a circuit diagram of a 90°-phase shifter according to one embodiment of the invention. The 90°-phase shifter of FIG. 3 comprises a 90°-phase shifting circuit section 1, a duty ratio monitoring load 2, a low-pass filter 3, and a direct current (DC) component amplifier 4.

The 90°-phase shifting circuit section 1 comprises a ½ frequency divider using a T flip-flop. More specifically, the 90°-phase shifting circuit section 1 includes signal input transistors Tr1 to Tr2, bi-differential transistors Tr5 to Tr12, and load resistances R1 to R4.

Input signal IN is inputted to the input terminal 5. The input terminal 5 is connected to a base of the signal input transistor Tr1 through a capacitance C1 which breaks the direct current component. A complementary input signal of the input signal IN is inputted to the input terminal 6. The input terminal 6 is connected to a base of the signal input transistor Tr2 through a capacitance C2 which breaks the direct current component. A constant-current source 7 is inserted between an earth and an emitter which is commonly connected to the emitters of signal input transistors Tr1 and Tr2.

The collector of the signal input transistor Tr1 is connected to the emitters both of the bi-differential transistors Tr5, Tr8, Tr10, and Tr11 through the resistance R5 constituting the duty ratio monitoring load 2. The collector of the signal input terminal Tr2 for the complementary signal is connected to the emitters both of the bi-differential transistors Tr6, Tr7, Tr9, and Tr12 through the resistance R6 constituting the duty ratio monitoring load 2. Here these resistances R5 to R6 are the elements for converting collector current of each of the signal input transistors Tr1 and Tr2 into voltage.

Both of the collectors of bi-differential transistors Tr5, Tr6, the collectors of bi-differential transistors Tr7, Tr8, the collectors of bi-differential transistors Tr9, Tr10, and the collectors of bi-differential transistors Tr11, Tr12 are connected to a voltage source (DC power supply) Vcc through the common load resistances R1, R2, R3, and R4. Furthermore, the commonly connected collectors of each of the bi-differential transistors are connected to both of the bases of bi-differential transistors Tr7, Tr9, the bases of bi-differential transistors Tr6, Tr12, the bases of bi-differential transistors Tr8, Tr11, and the bases of bi-differential transistors Tr5, Tr10 each.

4-phases output terminals 11, 12, 13, and 14 are extended from the collectors which are connected commonly with each other. Phase difference signals of 0°, 180°, 90°, and 270° are outputted from the output terminals each.

Figure 3:
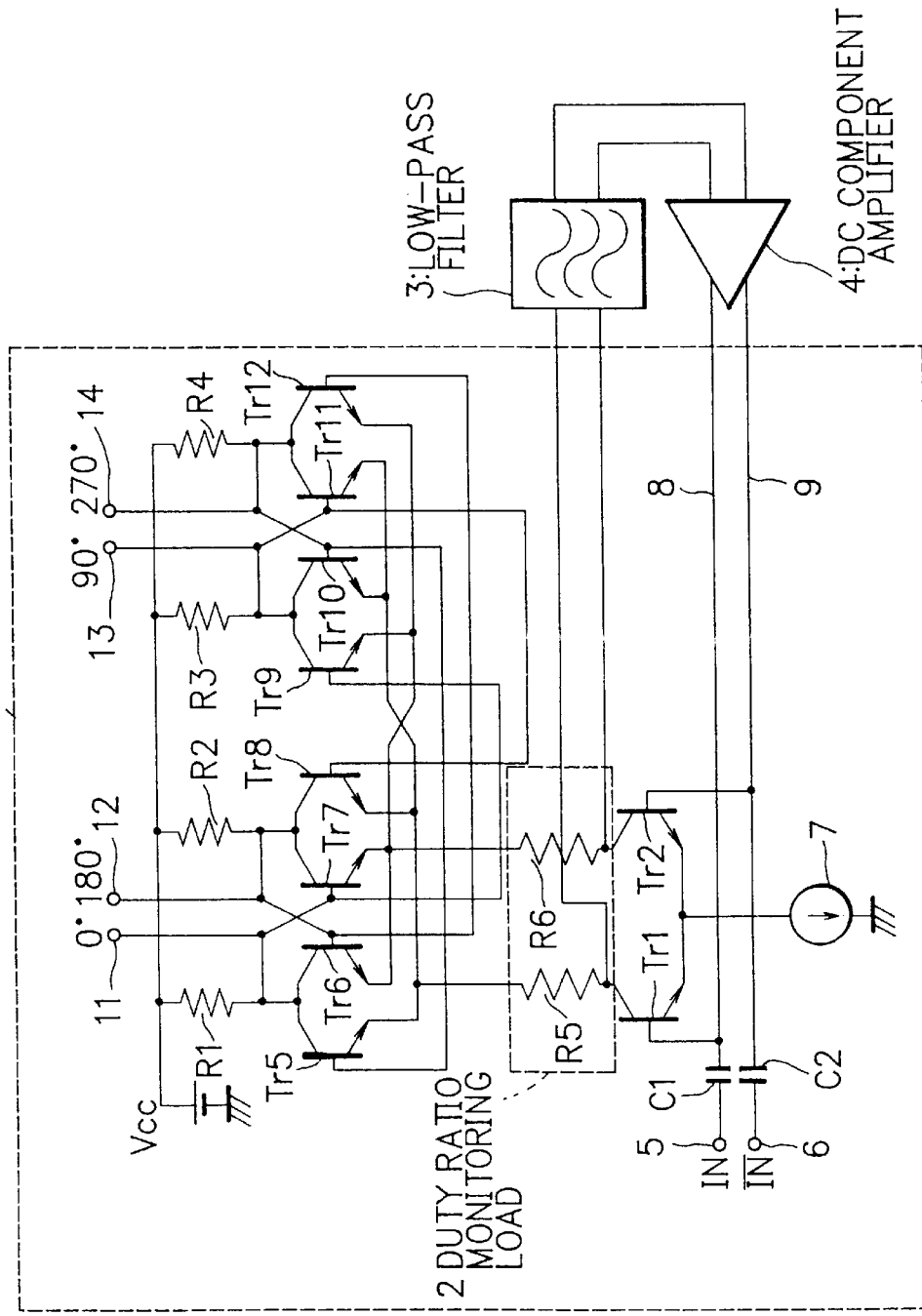
FIG. 3 is a circuit diagram of a 90°-phase shifter according to one embodiment of the present invention.

Next, each of the collectors of signal input transistors Tr1 and Tr2 is connected to the low-pass filter 3. The low-pass filter 3 outputs average electric potential (DC component) which corresponds to the offset of the duty ratio between the bases (input terminals 8 and 9) of the signal input transistors Tr1 and Tr2. The output voltage is inputted differentially to the DC component amplifier 4 to be amplified. The output side of the DC component amplifier 4 is connected such that the bases of the signal input transistors Tr1 and Tr2 are subjected to negative feedback of the DC component. As shown in FIG. 3, both of the low-pass filter 3 and the DC component amplifier 4 are constituted such that it causes the differential signal to input/output.

[CIRCUIT OPERATION]

Figure 5A:
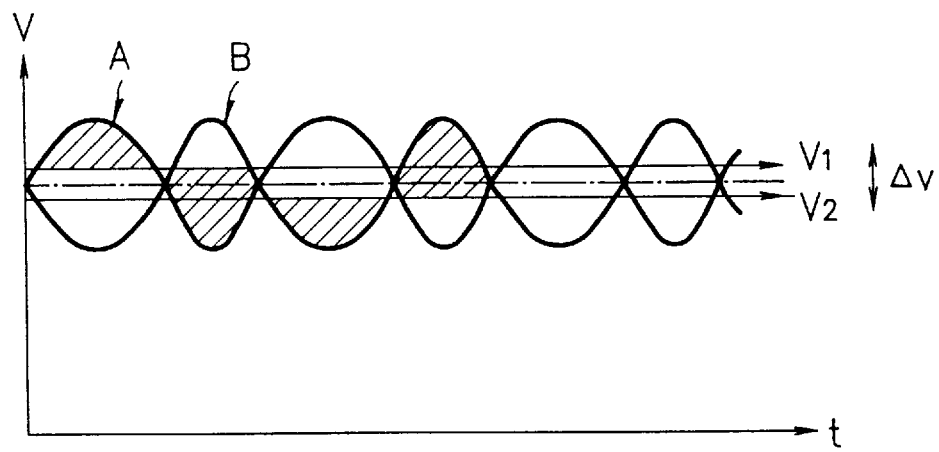
FIG. 5A is a timing chart showing operation of a 90°-phase shifter until arriving at a stable state and a waveform diagram of the input terminals 8 and 9 of the signal input transistors Tr1 and Tr2 before being subjected to feedback.
Figure 5B:
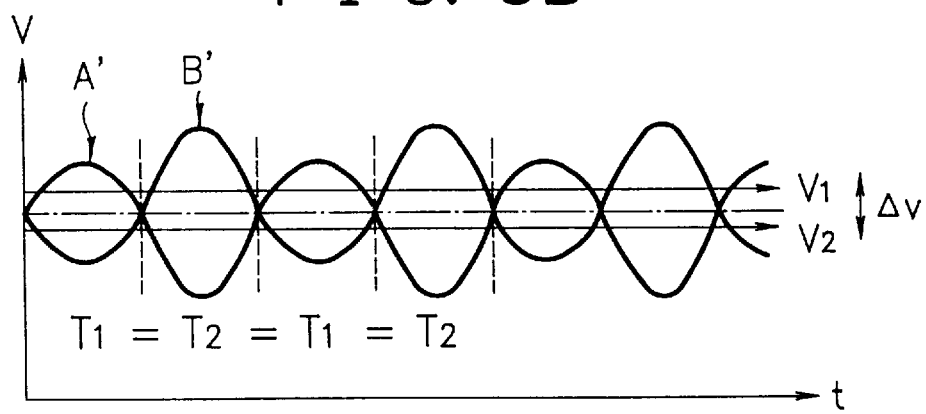
FIG. 5B is a timing chart showing operation of a 90°-phase shifter until arriving at a stable state and a waveform diagram of the input terminals 8 and 9 of the signal input transistors Tr1 and Tr2 being subjected to feedback.
Figure 5C:
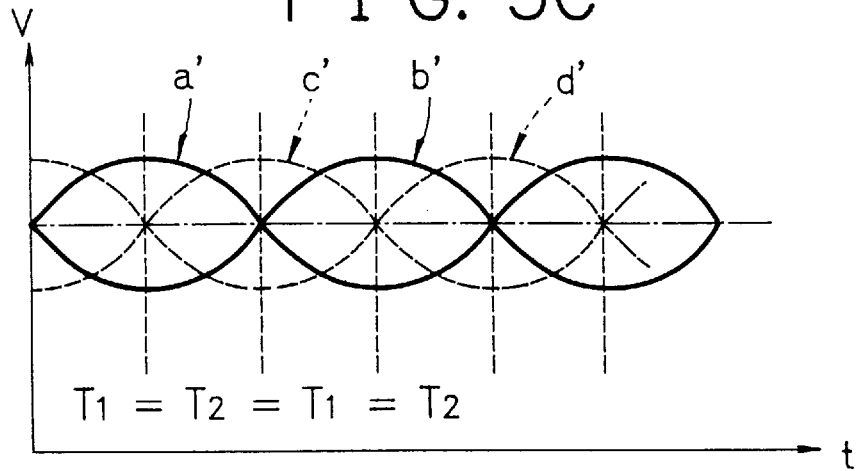
FIG. 5C is a timing chart showing operation of a 90°-phase shifter until arriving at a stable state and a waveform of diagram of the output terminals 11 to 14 in the stable state.

Operation of the 90°-phase shifter according to the above-described constitution of the embodiment will now be described in detail referring to the timing chart of FIGS. 4A, 4B, 5A, 5B, and 5C. FIGS. 4A and 4B are the timing chart of initial state. FIGS. 5A, 5B, and 5C are the timing chart of the variation of condition until arriving at the stable state. In these drawings, the quadrature axis represents time t, and the longitudinal axis represents voltage v.

Hereafter, explanation of operation will be implemented on condition that distortion occurs at the two input signal waveforms in the input terminals 5 and 6 of the 90° phase shifting circuit section 1, and that as shown in signal waveforms A and B of FIG. 4A, the signal waveform (frequency is f0) whose duty ratio is not 50% is inputted.

It takes the switching times of the signal input transistors Tr1 and Tr2 for T1 and T2 each. The relation of these switching times at initial point of time becomes T1≠T2. Under the condition, each of the output terminals 11 to 14 of the 90°-phase shifter output the signal with signal waveforms a, b, c, and d whose phase relations are of 0°, 180°, 90°, 270°, respectively, as shown in FIG. 4B. The frequency of these signal waveforms a to d are frequency divided by means of the T flip-flop into (½)f0 in all cases. An output delay t1 of the signal waveform c based on an output of the signal waveform a becomes t1=(T1−T2), with the result that the deviation from 90°-phase difference occurs.

Next, there is remarked on the collector electric potential of the signal input transistors Tr1 and Tr2, in cases where the signals with distortion are applied to the input terminals 5 and 6, electric potential difference occurs between the collectors, as shown in FIG. 5A. Namely, average voltage value of the signal waveform A becomes voltage V1 as shown in the same drawing. On the other hand, average voltage value of the signal waveform B becomes voltage V2 as shown in the same drawing. Consequently, when it causes these voltages V1 and V2 to pass through the low-pass filter 3, DC electric potential difference is represented as Δv=V1−V2 which is obtained in such a way that the difference between the signal waveform A and the signal waveform B is subjected to the differential calculation. The DC electric potential difference Δv is amplified by the DC component amplifier 4. The amplified DC electric potential difference Δv is given to the input terminals 8 and 9 of the signal input transistors Tr1 and Tr2. As a result, the negative bias of the transistor is subjected to the negative feedback.

As shown in FIG. 4A, when the relation of T1 and T2 is T1>T2, the bias voltage of the input terminal 8 relatively drops, while the bias voltage of the input terminal 9 relatively rises. The signal waveform of the input terminals 8 and 9 becomes the signal waveform A' and B' each as shown in FIG. 5B. And after this time, above stated feedback operation is repeated. The DC electric potential difference Δv gradually decreases with the time elapse. The bias electric potential of the signal input transistors Tr1 and Tr2 converge.

When the loop gain is optimized, after the bias electric potential of the signal input transistors Tr1 and Tr2 converges, the switching time of these signal input transistors Tr1 and Tr2 becomes equal, thus bringing the condition of T1=T2. Consequently, as shown in FIG. 5C, at the output terminals 11, 12, 13, and 14, 4-phases output a', b', c', and d' which remain of precise 90°-phase difference are obtained.

As described above, in cases where DC offsets exist between the input signals applied to the 90°-phase shifting circuit section 1, or the duty ratio is not maintained of 50% caused by waveform distortion, differences occur between average currents flowing through the collectors of the signal input transistors Tr1 and Tr2. The difference between the average current flow is converted into voltage by the loads (resistances R5, R6) connected to respective collectors of the signal input transistors Tr1 and Tr2. And then DC component thereof corresponding to the offset of duty ratio is taken off through the low-pass filter 3. The DC component is amplified by the DC component amplifier 4. The input terminals 8 and 9 of the 90°-phase shifting circuit section 1 are subjected to the feedback of the DC component as the input bias such that it causes the duty ratio to correct. For these reasons, the value of duty ratio of the input signals corresponding to the signal input transistors Tr1 and Tr2 precisely comes into 50%. As a result, exact 90°-phase difference output signal is obtained.

When the 90°-phase shifter according to the present invention is employed, there is ascertained that the phase error to the DC offset or the offset of the duty ratio of the input signal is improved. Namely, according to the first experiment, when the offset of 20 mV exists between the input signals of the 90°-phase shifter, and when the duty ratio between the input signals is shifted with only 5%, in both cases, the phase error is improved from 1.5° to less than 0.1°. Furthermore, according to the second experiment, when the duty ratio between the input signals is shifted with only 2%, in such the case, the phase error is improved from 1.5° to less than 0.2°.

[MODIFIED EMBODIMENT]

Figure 6:
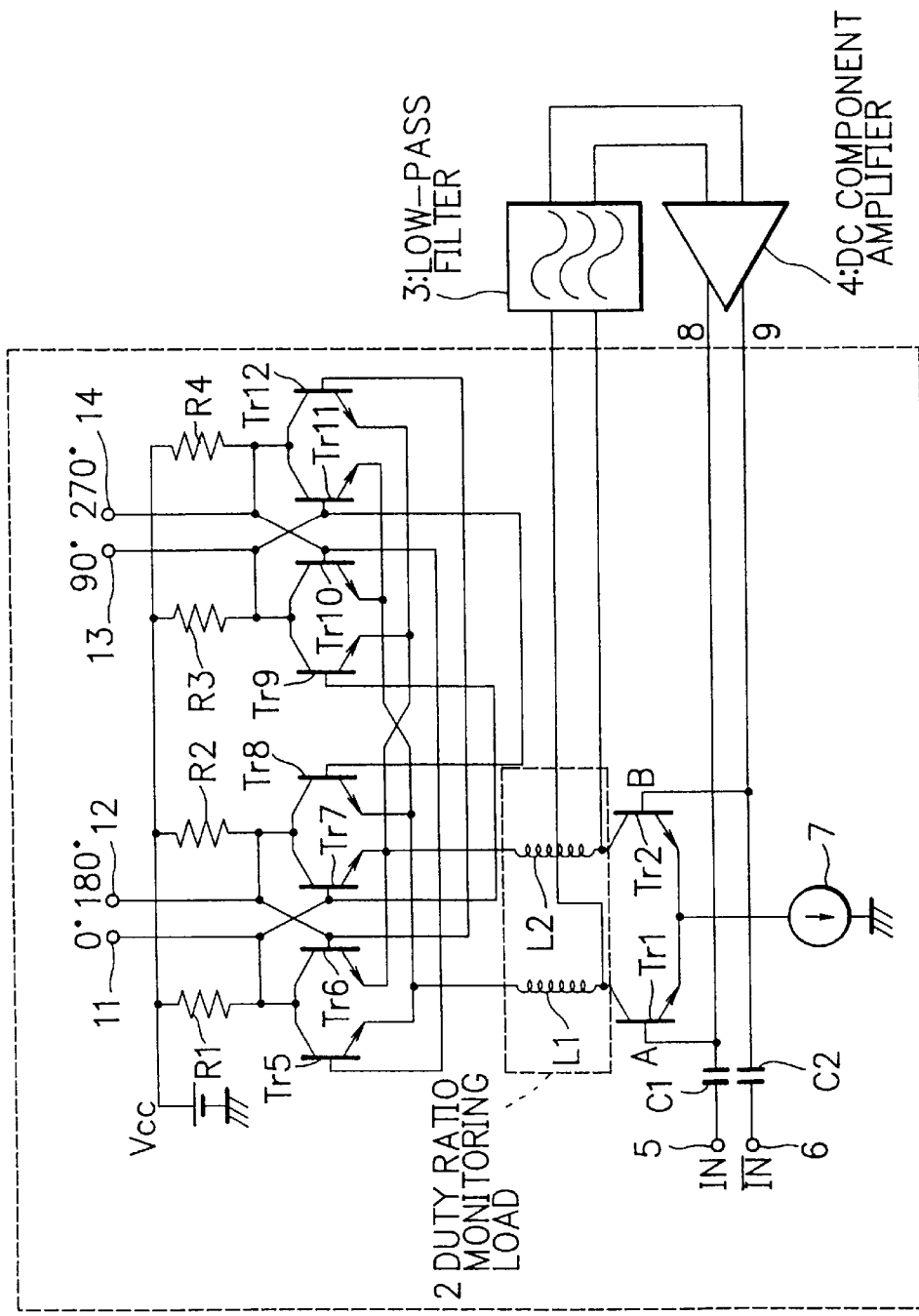
FIG. 6 is a circuit diagram showing a 90°-phase shifter according to another embodiment of the invention.

As shown in FIG. 6, when there is constituted a duty ratio monitoring load 2, it is suitable that an inductance is used as a substitute for a resistance. The same operation and effect as the above embodiment are obtained due to such constitution.

As described above, according to the present invention, it causes the DC component corresponding to the offset from the 50%-duty ratio to calculate to each of the first and the second input signals. The input terminal end of the phase shift means which generates signals of 90°-phase difference is subjected to the feedback of the DC component. For example when these measures are employed for the 90°-phase shifter with T flip-flop, even if the duty ratio of the first or the second input signal is shifted from the 50% value, there is the effect that the output signal with precise 90°-phase difference is obtained. Furthermore, according to the constitution, since the comparator or the operational amplifier as the conventional equipment is not required, there is effect that the stable 90°-phase shifter with low dissipation power is realized in the high-frequency band.

While preferred embodiments of the invention have been described using specific terms, such description is for illustrative purpose only, and it is to be understood that changes and variations may be made without departing from the spirit or scope of the following claims.

What is claimed is:

1. A phase shifter comprising:
   a frequency divider;
   a phase shifting means, connected to said frequency divider, for generating output signals with a predetermined phase difference, said phase shifting means generating said output signals based on a first input signal and a second input signal into said frequency divider, said second input signal being a complementary signal of said first input signal;
   a detection circuit, connected between said frequency divider and said phase shifting means, which detects a DC component corresponding to an offset error in at least one of said first and said second input signals; and
   a feedback circuit, connected to said detection circuit, which feeds back said DC component as a bias into at least one input terminal of said frequency divider.

2. A phase shifter according to claim 1, wherein said frequency divider includes a first transistor and a second transistor into which said first and said second input signals are inputted, and
   wherein said detection circuit includes a first load and a second load connected to respective collectors of said first and said second transistors for converting current from said respective collectors into respective voltage signals for input into said phase shifting means.

3. A phase shifter according to claim 2, wherein said first and second loads are one of resistance elements and inductance elements 7.

4. A phase shifter according to claim 1, wherein said feedback circuit includes a first circuit for taking off said DC component from an electric potential difference between a first load and a second load of said detection circuit, and a second circuit for amplifying said DC component before outputting said DC component into said at least one input terminal of said frequency divider.

5. A phase shifter according to claim 2, wherein said feedback circuit includes a first circuit for taking off said DC component from an electric potential difference between said first and said second loads, and a second circuit for amplifying said DC component before outputting said DC component into said at least one input terminal of said frequency divider.

6. A phase shifter according to claim 3, wherein said feedback circuit includes a first circuit for taking off said DC component from an electric potential difference between said first and said second loads, and a second circuit for amplifying said DC component before outputting said DC component into said at least one input terminal of said frequency divider.

7. A phase shifter according to claim 1, wherein said offset error is one selected from a group consisting of an offset in at least one of said first and said second input signals from a 50%-duty ratio and a DC offset between said first and said second input signals.

8. A phase shifter according to claim 7, wherein feeding back said DC component to said at least one input terminal of said frequency divider causes said first and said second input signals to be maintained at a 50% duty ratio, so as to correct a phase error between said output signals caused by said offset error in at least one of said first and said second input signals.

9. A phase shifter according to claim 8, wherein said predetermined phase difference is a phase difference lying in a range of between 0° and 360° inclusive.

10. A phase shifter according to claim 1, wherein said frequency divider is a ½ frequency divider.

11. A phase shifter according to claim 1, wherein said frequency divider includes a T flip-flop circuit.

12. A phase shifter according to claim 4, wherein said first circuit is a low-pass filter.

13. A phase shifter according to claim 5, wherein said first circuit is a low-pass filter.

14. A phase shifter according to claim 6, wherein said first circuit is a low-pass filter.

* * * * *